(12) United States Patent
Camacho et al.

(10) Patent No.: US 8,502,371 B2
(45) Date of Patent: Aug. 6, 2013

(54) INTEGRATED CIRCUIT PACKAGE SYSTEM WITH EXTENDED CORNER LEADS

(75) Inventors: Zigmund Ramirez Camacho, Singapore (SG); Lionel Chien Hui Tay, Singapore (SG); Jairus Legaspi Pisigan, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 524 days.

(21) Appl. No.: 11/965,550

(22) Filed: Dec. 27, 2007

(65) Prior Publication Data

US 2009/0166845 A1 Jul. 2, 2009

(51) Int. Cl.
*H01L 23/48* (2006.01)
*H01L 21/00* (2006.01)

(52) U.S. Cl.
USPC ............... 257/696; 257/E23.048; 438/124

(58) Field of Classification Search
USPC ...................... 257/E23.048, 692, 695, 696
See application file for complete search history.

(56) References Cited

U.S. PATENT DOCUMENTS

| | | | |
|---|---|---|---|
| 5,173,764 A | 12/1992 | Higgins, III | |
| 5,299,097 A * | 3/1994 | Kondo et al. | 361/813 |
| 5,485,037 A | 1/1996 | Marrs | |
| 5,559,306 A | 9/1996 | Mahulikar | |
| 5,650,659 A | 7/1997 | Mostafazadeh et al. | |
| 6,093,957 A * | 7/2000 | Kwon | 257/666 |
| 6,614,102 B1 | 9/2003 | Hoffman et al. | |
| 6,847,099 B1 | 1/2005 | Bancod et al. | |
| 6,867,071 B1 | 3/2005 | Lee et al. | |
| 6,951,776 B2 | 10/2005 | Lo et al. | |
| 2002/0030266 A1 * | 3/2002 | Murata | 257/698 |
| 2005/0125568 A1 | 6/2005 | Yeo et al. | |
| 2006/0103009 A1 | 5/2006 | Lee et al. | |
| 2007/0063322 A1 | 3/2007 | Chow et al. | |
| 2007/0090502 A1 | 4/2007 | Zhao et al. | |
| 2007/0164409 A1 | 7/2007 | Holland | |
| 2008/0006926 A1 | 1/2008 | Bathan et al. | |

FOREIGN PATENT DOCUMENTS

WO WO97/27627 7/1997

* cited by examiner

*Primary Examiner* — Ha Tran T Nguyen
*Assistant Examiner* — Raj R Gupta
(74) *Attorney, Agent, or Firm* — Ishimaru & Associates LLP

(57) ABSTRACT

An integrated circuit package system including: forming a die pad, wherein the die pad has a tiebar at a corner; forming a lead wherein the lead is connected to the tiebar; connecting an integrated circuit die to the die pad; and forming an encapsulation, having an edge, over the integrated circuit die with the lead extending from and beyond the edge.

20 Claims, 8 Drawing Sheets

INTEGRATED CIRCUIT PACKAGE SYSTEM WITH EXTENDED CORNER LEADS

TECHNICAL FIELD

The present invention relates generally to integrated circuit systems, and particularly to integrated circuit packaging systems.

BACKGROUND ART

With the growth of the consumer and industrial electronics industry and the simultaneous decline of the military market in the 1990's, rapid changes have occurred in the electronics industry. As a result, the U.S. electronics market began operating much like the Japanese consumer electronics market with higher pressures to reduce costs and shrink packaging size.

The rapidly growing portable electronics markets, e.g. cellular phones, laptop computers, and PDAs, are integral facets of modern life and each are operated by an integrated circuit ("I.C.") with strict packaging demands. These devices have unique attributes which have significant impacts on manufacturing integration, in that they must be generally small, light weight, and rich in functionality and they must be produced in high volumes at relatively low cost. Future electronic systems may be more intelligent, have higher density, use less power, operate at higher speed, and may include mixed technology devices and assembly structures at lower cost than today.

To meet such demands, manufacturers have begun integrating more circuit functions, shrinking device features, and increasing speeds. As an extension of the I.C. industry, the electronics packaging industry has also witnessed similar technological and market dynamics. I.C.'s are typically protected from the external environment by transfer molding a thermoset or thermoplastic resin about the device. This package provides protection from dust, humidity and other environmental factors which can destroy the delicate circuitry.

From a packaging perspective, smaller form factors, requirements for more input/output signals and power management all became major technology drivers. Sophisticated new products of all types began developing, and soon barriers were reached with conventional packages and processes. No clear cost effective technology has yet been identified. Beyond the performance requirements of next generation devices, the industry now demands that cost be a primary product differentiator in an attempt to meet profit goals.

There have been many approaches to addressing the advanced packaging requirements of microprocessors and portable electronics with successive generations of I.C.'s. Many industry road maps have identified significant gaps between the present integrated circuit capability and the available supporting electronic packaging technologies. The limitations and issues with present packaging technologies include increasing clock rates, electromagnetic interference (EMI), thermal loads, second level assembly reliability stresses and cost.

EMI in particular is a problem. This form of radiation can be created by complex present loops on the printed circuit board (PCB) or it can come from external sources like cell phones and radio towers. EMI can interfere with the functionality and reliability of some I.C.'s and has little effect on others. Many approaches have been developed to shield components from EMI. These approaches include inherent package shielding and bulky metalized enclosures. These approaches are costly in process time, design time, raw materials, space, and line yield. Market pressure and EMI disruption combine to create a need for a versatile and cost effective solution. As the commercial pressures continue to drive a wedge between custom packaging solutions and cost, an ever-greater need is created to find a solution to this problem.

Thus, a need still remains for low cost and versatility. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a die pad, wherein the die pad has a tiebar at a corner; forming a lead wherein the lead is connected to the tiebar; connecting an integrated circuit die to the die pad; and forming an encapsulation, having an edge, over the integrated circuit die with the lead extending from and beyond the edge.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
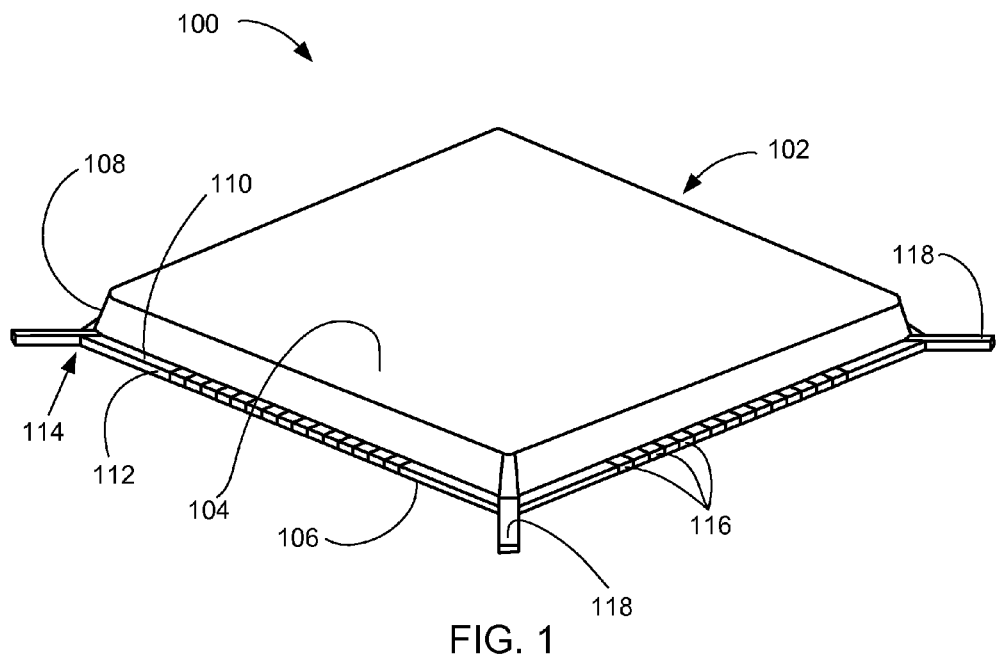
FIG. 1 is an isometric view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations are not disclosed in detail. Likewise, the drawings showing embodiments of the system are semi-diagrammatic and not to scale and, particularly, some of the dimensions are for the clarity of presentation and are shown greatly exaggerated in the drawing FIG's. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "encompasses" or "encompass" is limited to the horizontal plane. The term "on" means there is direct contact among elements. The term "rectangle" or "rectangular" means any combination of side lengths with a 90-degree corner including isometric sides. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown an isometric view of an integrated circuit package system 100 in a first embodiment of the present invention. The integrated circuit package system 100, such as a quad flat pack with no leads (QFN), includes an encapsulation 102.

The encapsulation 102, such as an epoxy mold compound (EMC), includes a top surface 104 and a bottom surface 106, which are on opposing sides of the encapsulation 102. The top surface 104 and the bottom surface 106 are shown as rectangular in which the top surface 104 is smaller in both length and width than the bottom surface 106. The encapsulation 102 is also shown having encapsulant corners 108.

The encapsulation 102 further includes an edge 110. The edge 110 is a portion of the bottom surface 106 that is exposed by the smaller dimension of the top surface 104 over the larger dimension of the bottom surface 106. The edge 110 has edge sides 112 corresponding to the rectangular shape of the bottom surface 106.

The edge 110 has corners 114 that correspond to the encapsulant corners 108. Exposed on the edge sides 112 are leads 116. At the corners 114 of the edge 110 are leads, such as, extended corner leads 118. The extended corner leads 118 extend out from the corners 114, and horizontally away from the edge 110.

Figure 2:
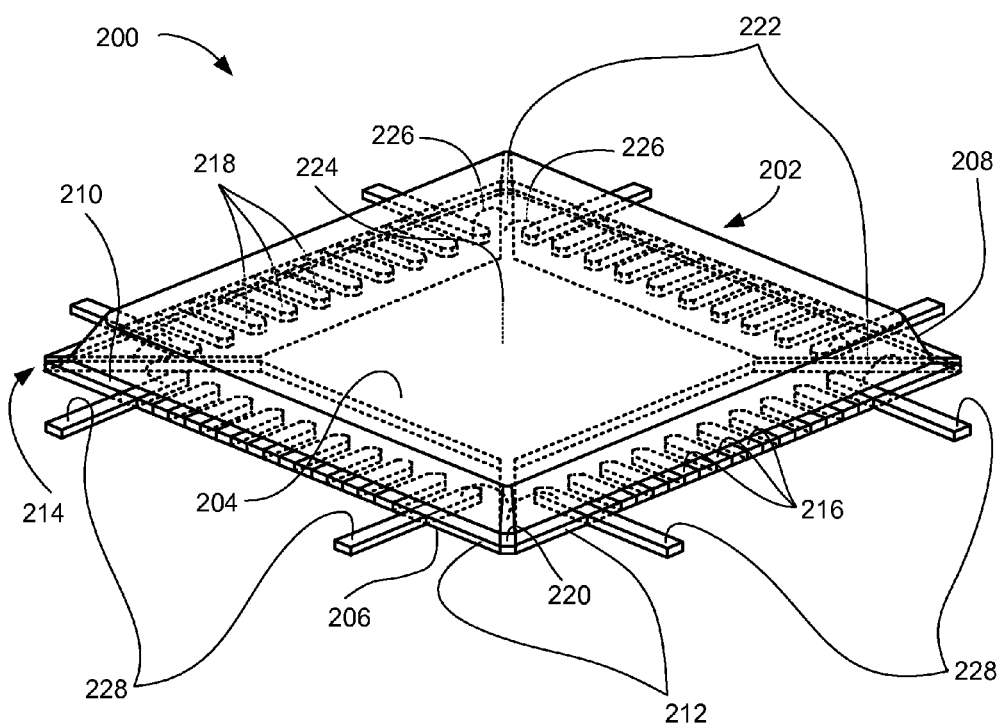
FIG. 2 is an isometric view of an integrated circuit package system in a second embodiment of the present invention.

Referring now to FIG. 2, therein is shown an isometric view of an integrated circuit package system 200 in a second embodiment of the present invention. The integrated circuit package system 200, such as a QFN, includes an encapsulation 202.

The encapsulation 202, such as an EMC, has a top surface 204 and a bottom surface 206, which are on opposing sides of the encapsulation 202. The top surface 204 and the bottom surface 206 are shown as rectangular in which the top surface 204 is smaller in both length and width than the bottom surface 206. The encapsulation 202 is also shown having encapsulant corners 208.

The encapsulation 202 further includes an edge 210. The edge 210 is a portion of the bottom surface 206 that is exposed by the smaller dimension of the top surface 204 over the larger dimension of the bottom surface 206. The edge 210 has edge sides 212 corresponding to the rectangular shape of the bottom surface 206.

The edge 210 has corners 214 that correspond to the encapsulant corners 208. Exposed on the edge sides 212 are leads 216. The encapsulated portion of the leads 216 are bond fingers 218.

At the corners 214 of the edge 210 are corner leads 220. The encapsulated portion of the corner leads 220 are tiebars 222. The tiebars 222 are attached to a die pad 224.

The bond fingers 218 may be connected to the tiebars 222 by conductive elements such as interconnects 226 to form leads, such as, extended side leads 228. The extended side leads 228 are shown extending horizontally away from the edge 210.

Figure 3:
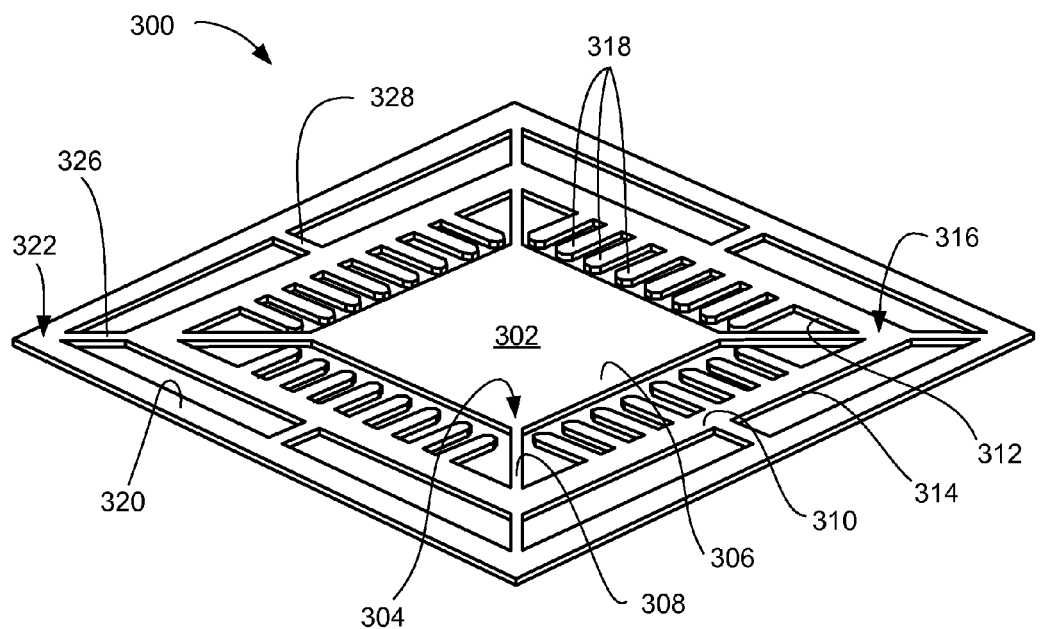
FIG. 3 is an isometric view of a leadframe used in the manufacture of integrated circuit package systems in various embodiments of the present invention.

Referring now to FIG. 3, therein is shown an isometric view of a leadframe 300 used in the manufacture of integrated circuit package systems in various embodiments of the present invention. The leadframe 300 is shown having a die pad 302. The die pad 302 is shown as rectangular with die pad corners 304, and die pad sides 306. Extending from the die pad corners 304 are die attached pad (DAP) tiebars 308. The DAP tiebars 308 terminate in a connection with a dambar 310.

The dambar 310 encompasses the die pad 302. The dambar 310 has an interior dambar side 312 and an exterior dambar side 314. The interior dambar side 312 faces the die pad 302, while the exterior dambar side 314 faces away from the die pad 302. The dambar 310 has dambar corners 316 corresponding to the die pad corners 304.

Along the interior dambar side 312 are terminal leads 318. The terminal leads 318 extend away from the dambar 310 toward the die pad 302. The terminal leads 318 do not contact the die pad 302 but are truncated. The leads 116 of FIG. 1 are formed from the terminal leads 318.

Further encompassing the die pad 302 peripheral to the dambar 310 is a connecting bar 320. The connecting bar 320 has connecting bar corners 322.

Connecting the dambar corners 316 to the connecting bar corners 322 are tiebar extensions 326. The extended corner leads 118 of FIG. 1 are formed from the tiebar extensions 326.

The extended corner leads 118 of FIG. 1 will remain connected to the tiebars 308 by the dambar corners 316 once the dambar 310 is removed. The exterior dambar side 314 has support tiebars 328 extending toward the connecting bar 320. The support tiebars 328 connect the exterior dambar side 314 to the connecting bar 320.

The leadframe 300 represents one example of how the present invention may be manufactured and it is understood by those skilled in the art that other leadframes may be used.

Figure 4:
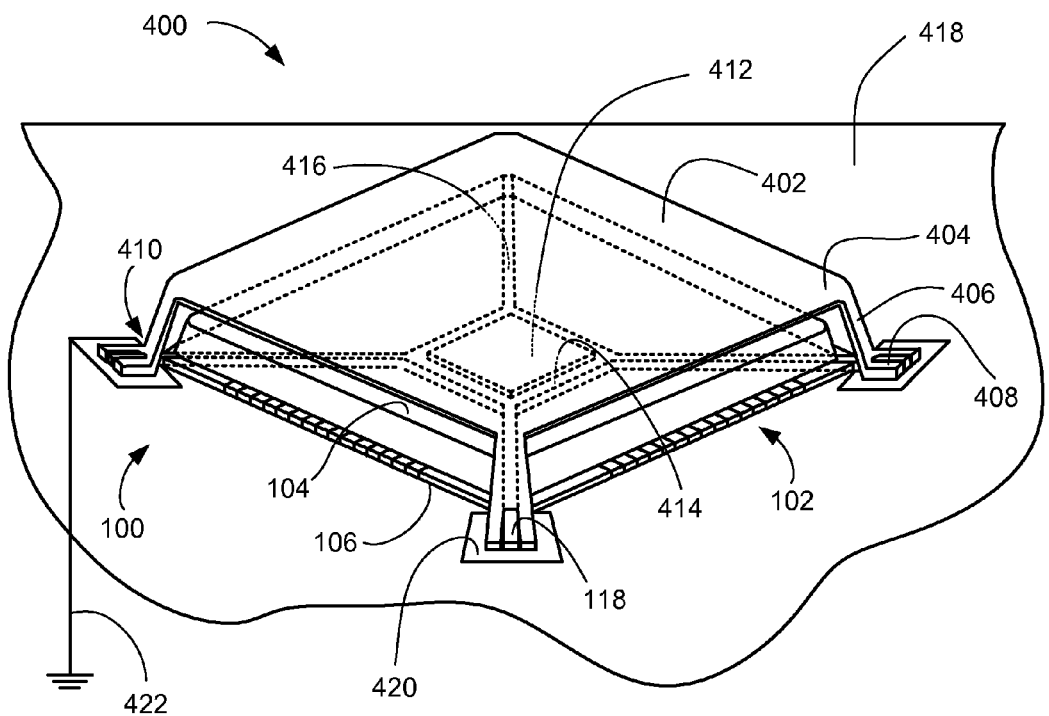
FIG. 4 is an isometric view of an integrated circuit package system in a third embodiment of the present invention.

Referring now to FIG. 4, therein is shown an isometric view of the integrated circuit package system 100 of FIG. 1 in a third embodiment of the present invention. The integrated circuit package system 100, is shown having a conductive shield 402 over the top surface 104. The conductive shield 402 is shown as a rectangle with shield corners 404.

Extending downward from the shield corners 404 are legs 406 which terminate in feet 408. The legs 406 support the conductive shield 402 and provide a conductive path to the extended corner leads 118. The legs 406 are connected to the extended corner leads 118 by the feet 408. The feet 408 have a bend 410 that match the angle of the feet 408 to the angle of the extended corner leads 118. The feet 408 can be fitted, soldered or both to the extended corner leads 118.

Internal to the encapsulation 102 is shown an integrated circuit die 412 mounted to a die pad 414. The die pad 414 is shown connected to the extended corner leads 118 by tiebars 416. The integrated circuit package system 100 is further shown mounted on a printed circuit board (PCB) 418.

The PCB 418 has grounded lands 420 on which the extended corner leads 118 and the feet 408 are mounted. The grounded lands 420 have a PCB level ground 422. The PCB level ground 422, provides a conductive path to ground the conductive shield 402 and the extended corner leads 118.

Figure 5:
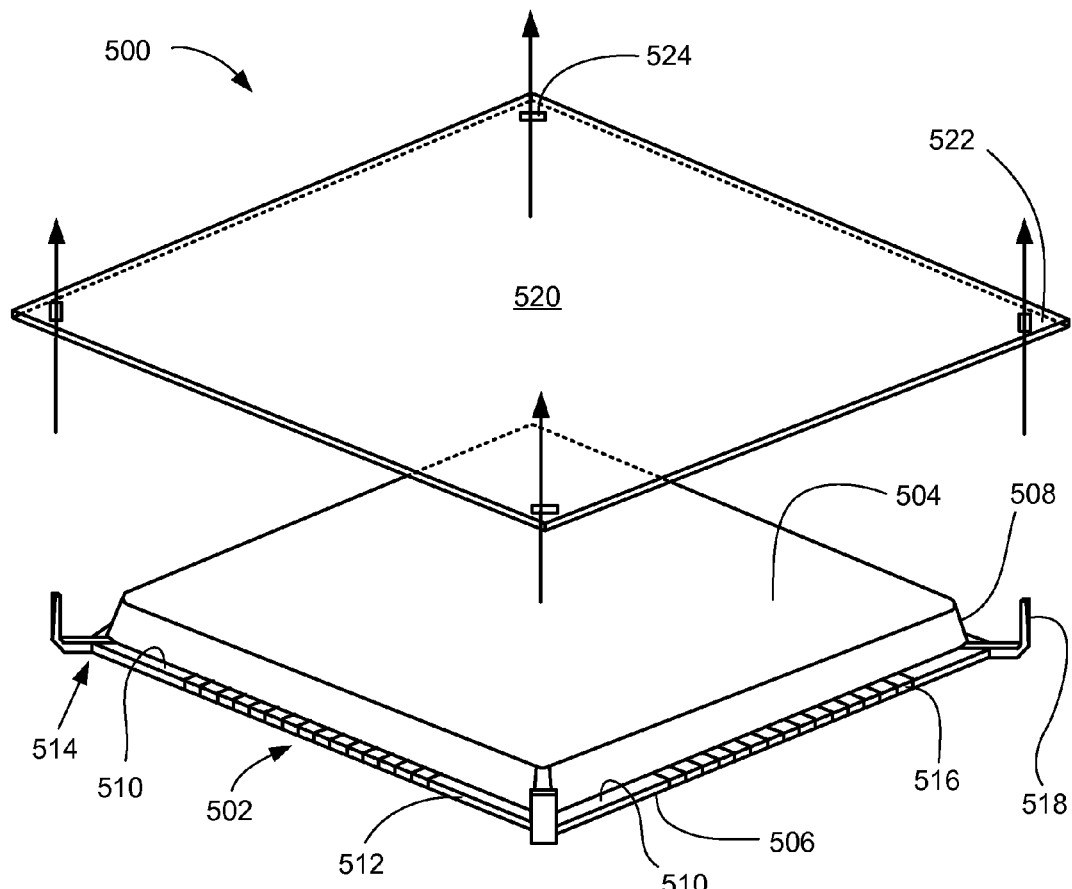
FIG. 5 is an isometric view of an integrated circuit package system in a fourth embodiment of the present invention.

Referring now to FIG. 5, therein is shown an isometric view of an integrated circuit package system 500 in a fourth embodiment of the present invention. The integrated circuit package system 500, such as a QFN, includes an encapsulation 502.

The encapsulation 502, such as an EMC, has a top surface 504 and a bottom surface 506, which are on opposing sides of the encapsulation 502. The top surface 504 and the bottom surface 506 are shown as rectangular in which the top surface 504 is smaller in both length and width than the bottom surface 506. The encapsulation 502 is also shown having encapsulant corners 508.

The encapsulation 502 further includes an edge 510. The edge 510 is a portion of the bottom surface 506 that is exposed by the smaller dimension of the top surface 504 over the larger dimension of the bottom surface 506. The edge 510 has edge sides 512 corresponding to the rectangular shape of the bottom surface 506.

The edge 510 has corners 514 that correspond to the encapsulant corners 508. Exposed on the edge sides 512 are leads 516. At the corners 514 of the edge 510 are leads, such as, raised corner leads 518. The raised corner leads 518 are bent upward away from the plane of the bottom surface 506.

The integrated circuit package system 500, is shown having a conductive shield 520 over the top surface 504. The conductive shield 520 such as a flat sheet has shield corners 522. These shield corners 522 have corresponding holes 524 through which the raised corner leads 518 can be passed.

The conductive shield 520 is affixed to the raised corner leads 518 by passing the raised corner leads 518 through the holes 524 and fixing the conductive shield 520 to the raised corner lead 518 by solder. In at least one embodiment, after fixing the conductive shield 520 and the raised corner lead 518 to one another, the conductive shield 520 can include at least one surface exposed to the external environment. The raised corner leads 518 stabilize and support the conductive shield 520. The raised corner leads 518 bend upward and the raised corner leads 518 extend above the encapsulation 502.

Figure 6:
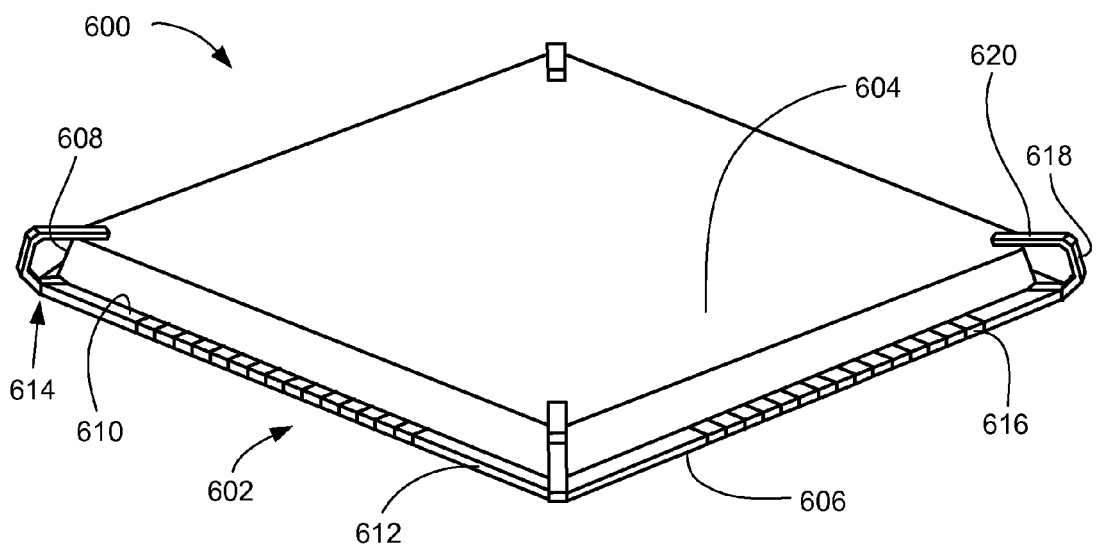
FIG. 6 is an isometric view of an integrated circuit package system in a fifth embodiment of the present invention.

Referring now to FIG. 6, therein is shown an isometric view of an integrated circuit package system 600 in a fifth embodiment of the present invention. The integrated circuit package system 600, such as a QFN, includes an encapsulation 602.

The encapsulation 602, such as an EMC, has a top surface 604 and a bottom surface 606, which are on opposing sides of the encapsulation 602. The top surface 604 and the bottom surface 606 are shown as rectangular in which the top surface 604 is smaller in both length and width than the bottom surface 606. The encapsulation 602 is also shown having encapsulant corners 608.

The encapsulation 602 further includes an edge 610. The edge 610 is a portion of the bottom surface 606 that is exposed by the smaller dimension of the top surface 604 over the larger dimension of the bottom surface 606. The edge 610 has edge sides 612 corresponding to the rectangular shape of the bottom surface 606.

The edge 610 has corners 614 that correspond to the encapsulant corners 608. Exposed on the edge sides 612 are leads 616. At the corners 614 of the edge 610 are leads, such as, curved corner leads 618. The curved corner leads 618 are bent over the top surface 604, and form a flat portion 620 on which a shield may rest.

Figure 7:
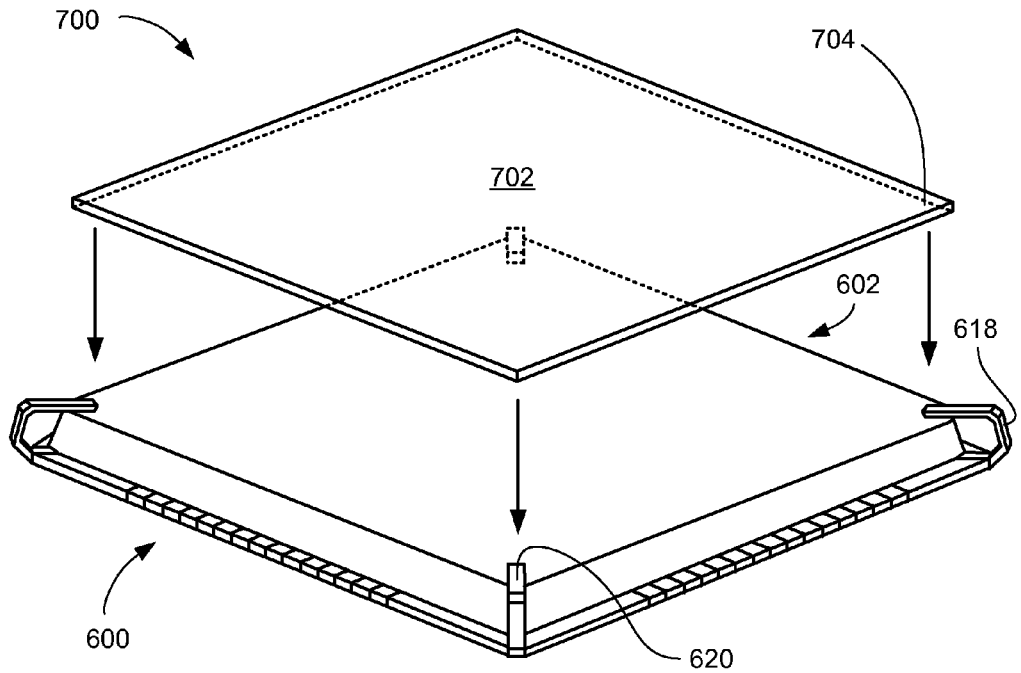
FIG. 7 is an isometric view of an integrated circuit package system in a sixth embodiment of the present invention.

Referring now to FIG. 7, therein is shown an isometric view of the integrated circuit package system 600 of FIG. 6, in a sixth embodiment of the present invention. The integrated circuit package system 600, is shown having a conductive shield 702 over the encapsulation 602. The conductive shield 702, such as a flat sheet, has shield corners 704. The shield corners 704 are connected to the curved corner leads 618 by direct contact to the flat portion 620. A solder joint can be used to secure the connection.

Figure 8:
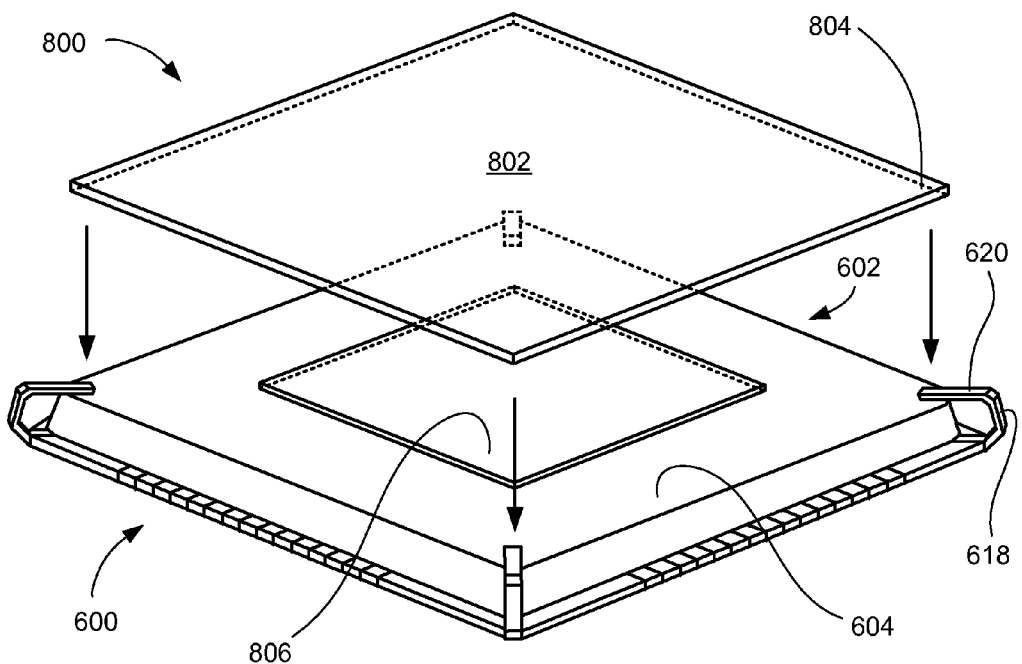
FIG. 8 is an isometric view of an integrated circuit package system in a seventh embodiment of the present invention.

Referring now to FIG. 8, therein is shown an isometric view of the integrated circuit package system 600 of FIG. 6, in a seventh embodiment of the present invention. The integrated circuit package system 600, is shown having a conductive shield 802 over the encapsulation 602. The conductive shield 802, such as a flat sheet, has shield corners 804. The shield corners 804 are connected to the curved corner leads 618 by direct contact to the flat portion 620. An adhesive 806 is sandwiched between the conductive shield 802 and the top surface 604.

The adhesive 806 secures the conductive shield 802 to the top surface 604. The conductive shield 802 makes an electrical connection to the curved corner leads 618 by contact. The adhesive 806 provides a high thermal and electrical conduction path from the top surface 604 and the curved corner leads 618 to the conductive shield 802.

Figure 9:
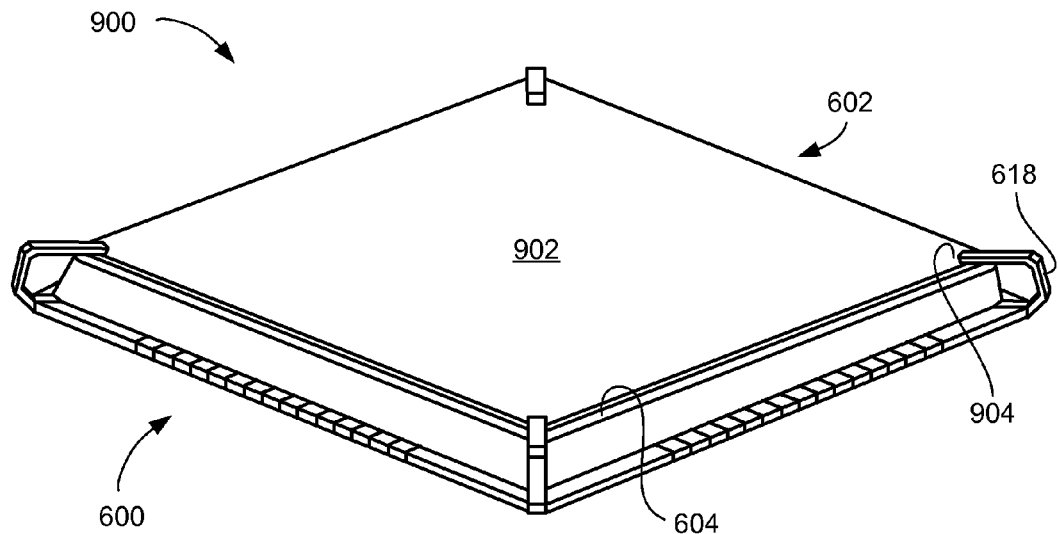
FIG. 9 is an isometric view of an integrated circuit package system in an eighth embodiment of the present invention.

Referring now to FIG. 9, therein is shown an isometric view of the integrated circuit package system 600 of FIG. 6, in an eighth embodiment of the present invention. The integrated circuit package system 600, is shown having a conductive shield 902 over the encapsulation 602. The conductive shield 902, such as a flat sheet, has shield corners 904. The conductive shield is affixed to the top surface 604 by crimping the curved corner leads 618 over the shield corners 904. An adhesive may also be sandwiched between the conductive shield 902 and the top surface 604. The adhesive would hold the conductive shield 902 in place, and provide a high thermal and electrical conductive path from the top surface 604 and the curved corner leads 618 to the conductive shield 902.

Figure 10:
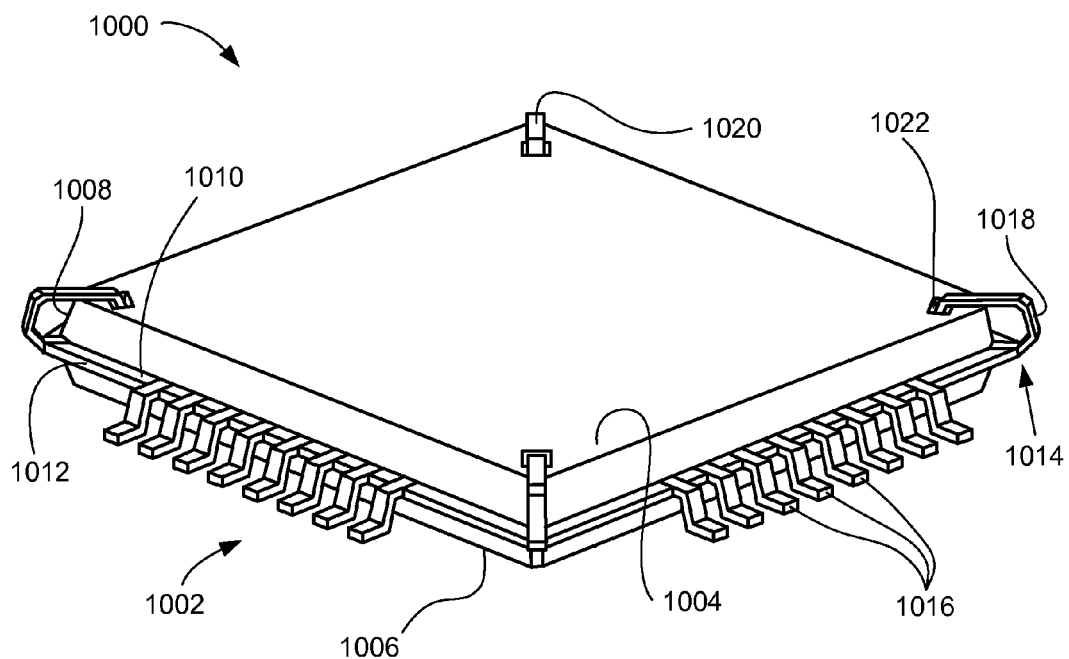
FIG. 10 is an isometric view of an integrated circuit package system in a ninth embodiment of the present invention.

Referring now to FIG. 10, therein is shown an isometric view of an integrated circuit package system 1000 in a ninth embodiment of the present invention. The integrated circuit package system 1000, such as a quad flat pack (QFP), includes an encapsulation 1002.

The encapsulation 1002, such as an EMC, has a top surface 1004 and a bottom surface 1006, which are on opposing sides of the encapsulation 1002. The top surface 1004 and the bottom surface 1006 are shown as rectangular in which the top surface 1004 is the same size as the bottom surface 1006. The encapsulation 1002 is also shown having encapsulant corners 1008.

The encapsulation 1002 further includes an edge 1010. The edge 1010 is part of the encapsulation 1002 between the top surface 1004 and the bottom surface 1006, which extends horizontally beyond both the top surface 1004 and the bottom surface 1006. The edge 1010 is thus a lip, or a minor extension, in the middle of the encapsulation 1002. The edge 1010 has edge sides 1012 corresponding to the rectangular shape of the bottom surface 1006.

The edge 1010 has corners 1014 that correspond to the encapsulant corners 1008. Extending from the edge sides 1012 are leads 1016. The leads 1016 are bent down below the plane of the bottom surface 1006 then out, away from the encapsulation 1002, and truncated to facilitate a surface mount. At the corners 1014 of the edge 1010 are leads, such as, C corner leads 1018. The C corner leads 1018 are bent over the top surface 1004, and form a flat portion 1020 on which a shield may rest. The flat portion 1020 is then bent down below the top surface 1004 into a depression 1022.

Figure 11:
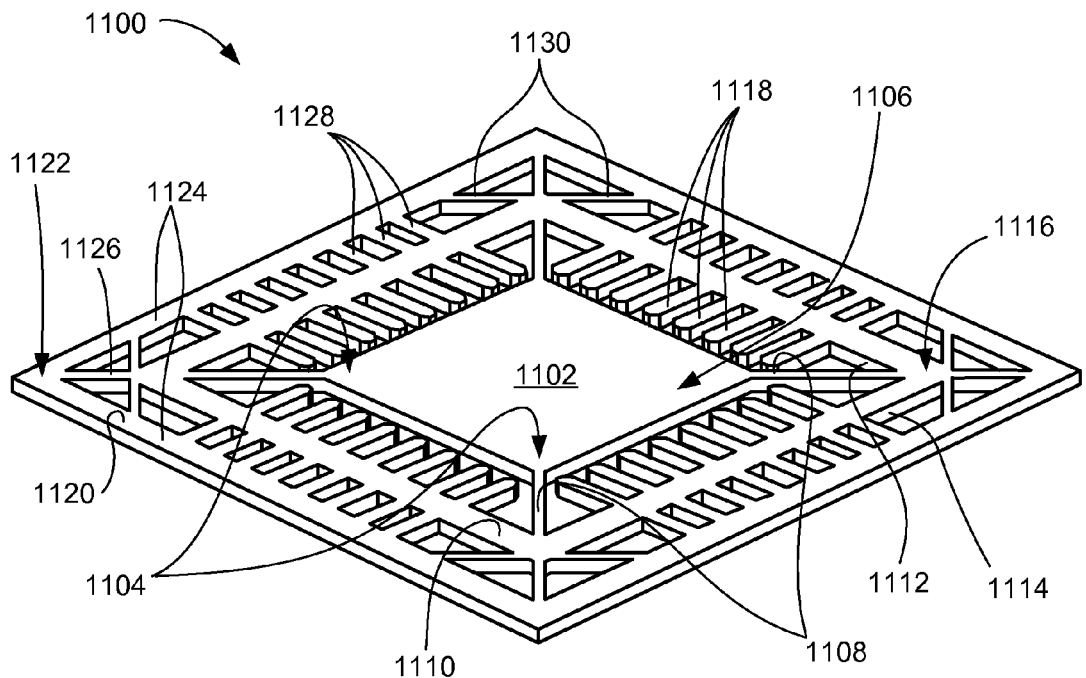
FIG. 11 is an isometric view of a leadframe used in the manufacture of integrated circuit package systems in various embodiments of the present invention.

Referring now to FIG. 11, therein is shown an isometric view of a leadframe 1100 used in the manufacture of integrated circuit package systems in various embodiments of the present invention. The leadframe 1100 is shown having a die pad 1102. The die pad 1102 is shown as rectangular with die pad corners 1104, and die pad sides 1106. Extending away from the die pad corners 1104 are DAP tiebars 1108. The DAP tiebars 1108 terminate in a connection with a dambar 1110.

The dambar 1110 encompasses the die pad 1102. The dambar 1110 has an interior dambar side 1112 and an exterior dambar side 1114. The interior dambar side 1112 faces the die pad 1102, while the exterior dambar side 1114 faces away from the die pad 1102. The dambar 1110 has dambar corners 1116 corresponding to the die pad corners 1104.

Along the interior dambar side 1112 are bond fingers 1118. The bond fingers 1118 extend away from the dambar 1110 toward the die pad 1102. The bond fingers 1118 do not contact the die pad 1102 but are truncated.

Further encompassing the die pad 1102 peripheral to the dambar 1110 is a connecting bar 1120. The connecting bar 1120 has connecting bar corners 1122 and connecting bar sides 1124.

Connecting the dambar corners 1116 to the connecting bar corners 1122 are tiebar extensions 1126. The curved corner leads 1018 of FIG. 10 are formed from the tiebar extensions 1126.

The exterior dambar side 1114 has terminal leads 1128 extending toward the connecting bar 1120. The terminal leads 1128 connect the exterior dambar side 1114 to the connecting bar 1120. The leads 1016 of FIG. 10 are formed from the terminal leads 1128.

Extending from all of the dambar corners 1116 are two support tiebars 1130. The support tiebars 1130 extend from the dambar corners 1116 to the connecting bar sides 1124.

The leadframe 1100 represents one example of how the present invention may be manufactured and it is understood by those skilled in the art that other leadframes may be used.

Figure 12:
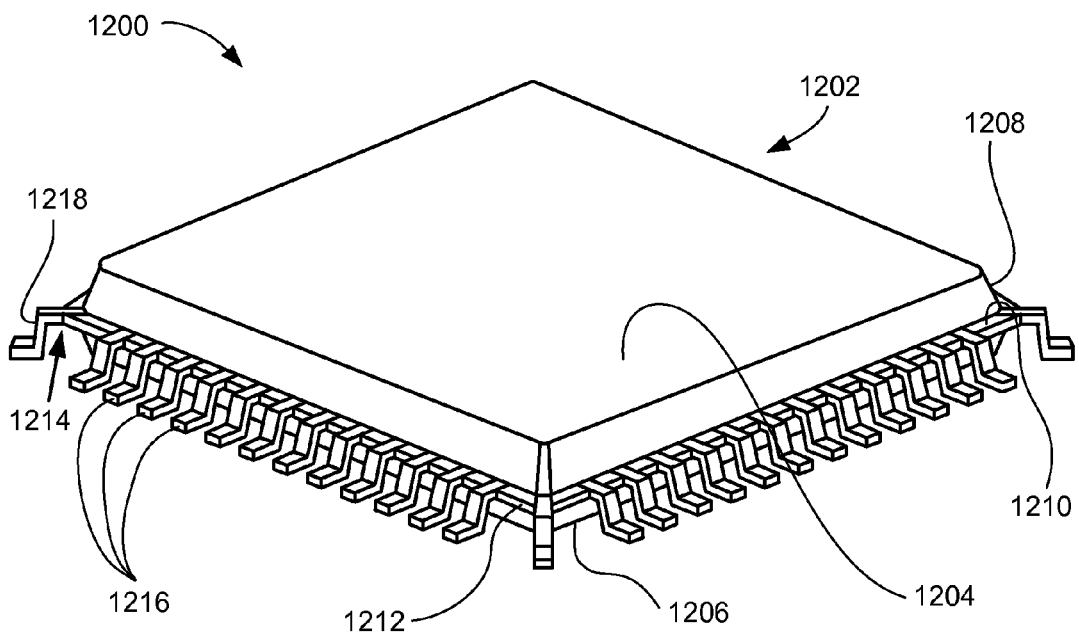
FIG. 12 is an isometric view of an integrated circuit package system in a tenth embodiment of the present invention.

Referring now to FIG. 12, therein is shown an isometric view of an integrated circuit package system 1200 in a tenth embodiment of the present invention. The integrated circuit package system 1200, such as a QFP, includes an encapsulation 1202.

The encapsulation 1202, such as an EMC, has a top surface 1204 and a bottom surface 1206, which are on opposing sides of the encapsulation 1202. The top surface 1204 and the bottom surface 1206 are shown as rectangular in which the top surface 1204 is the same size as the bottom surface 1206. The encapsulation 1202 is also shown having encapsulant corners 1208.

The encapsulation 1202 further includes an edge 1210. The edge 1210 is part of the encapsulation 1202, between the top surface 1204 and the bottom surface 1206, which extends horizontally beyond both the top surface 1204 and the bottom surface 1206. The edge 1210 is thus a lip, or a minor extension, in the middle of the encapsulation 1202. The edge 1210 has edge sides 1212 corresponding to the rectangular shape of the bottom surface 1206.

The edge 1210 has corners 1214 that correspond to the encapsulant corners 1208. Extending from the edge sides 1212 are leads 1216. The leads 1216 are bent down below the plane of the bottom surface 1206 then out, away from the encapsulation 1202, and truncated to facilitate a surface mount.

At the corners 1214 of the edge 1210 are leads, such as, surface mount corner leads 1218. The surface mount corner leads 1218 are bent down below the plane of the bottom surface 1206 then out, away from the encapsulation 1202, and truncated to facilitate a surface mount.

Figure 13:
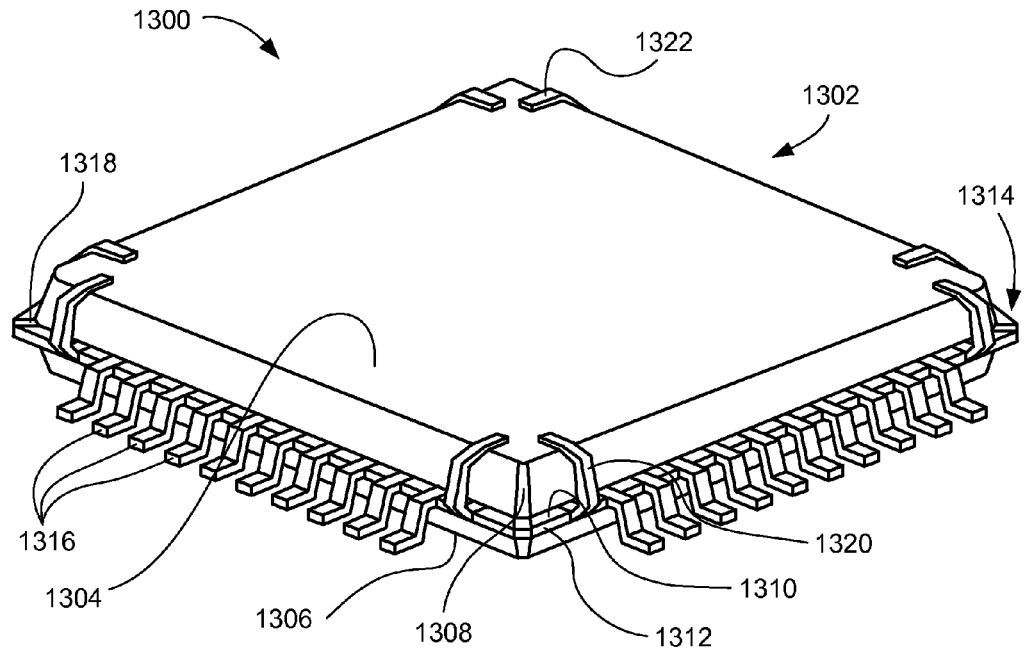
FIG. 13 is an isometric view of an integrated circuit package system in an eleventh embodiment of the present invention.

Referring now to FIG. 13, therein is shown an isometric view of an integrated circuit package system 1300 in an eleventh embodiment of the present invention. The integrated circuit package system 1300, such as a QFP, includes an encapsulation 1302.

The encapsulation 1302, such as an EMC, has a top surface 1304 and a bottom surface 1306, which are on opposing sides of the encapsulation 1302. The top surface 1304 and the bottom surface 1306 are shown as rectangular in which the top surface 1304 is the same size as the bottom surface 1306. The encapsulation 1302 is also shown having encapsulant corners 1308.

The encapsulation 1302 further includes an edge 1310. The edge 1310 is part of the encapsulation 1302, between the top surface 1304 and the bottom surface 1306, which extends horizontally beyond both the top surface 1304 and the bottom surface 1306. The edge 1310 is thus a lip, or a minor extension, in the middle of the encapsulation 1302. The edge 1310 has edge sides 1312 corresponding to the rectangular shape of the bottom surface 1306.

The edge 1310 has corners 1314 that correspond to the encapsulant corners 1308. Extending from the edge sides 1312 are leads 1316. The leads 1316 are bent down below the plane of the bottom surface 1306 then out, away from the encapsulation 1302, and truncated to facilitate a surface mount.

At the corners 1314 of the edge 1310 are leads, such as, corner leads 1318. The corner leads 1318 may, for example, be internally connected to any of the leads 1316 to create curved side leads 1320. The curved side leads 1320 are shown here, nearest the corner leads 1318 on the edge sides 1312 adjacent to the corners 1314. The curved side leads 1320 are shown bent over the top surface 1304, and form a flat portion 1322 on which a shield may rest.

Figure 14:
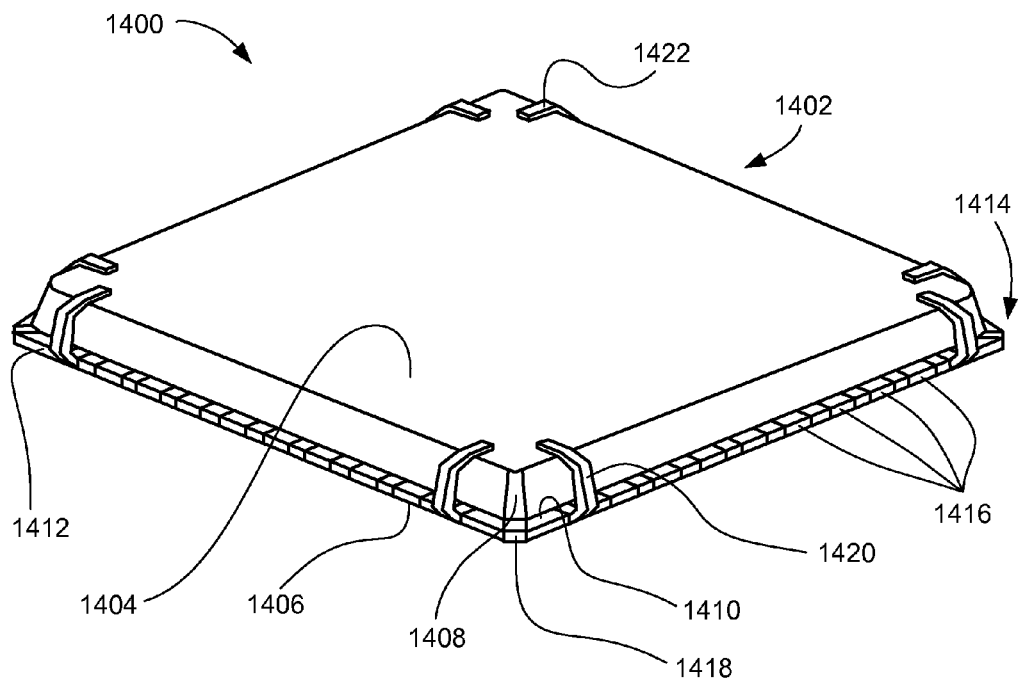
FIG. 14 is an isometric view of an integrated circuit package system in a twelfth embodiment of the present invention.

Referring now to FIG. 14, therein is shown an isometric view of an integrated circuit package system 1400 in a twelfth embodiment of the present invention. The integrated circuit package system 1400, such as a QFN, includes an encapsulation 1402.

The encapsulation 1402, such as an EMC, has a top surface 1404 and a bottom surface 1406, which are on opposing sides of the encapsulation 1402. The top surface 1404 and the bottom surface 1406 are shown as rectangular in which the top surface 1404 is smaller in both length and width than the bottom surface 1406. The encapsulation 1402 is also shown having encapsulant corners 1408.

The encapsulation 1402 further includes an edge 1410. The edge 1410 is a portion of the bottom surface 1406 that is exposed by the smaller dimension of the top surface 1404 over the larger dimension of the bottom surface 1406. The edge 1410 has edge sides 1412 corresponding to the rectangular shape of the bottom surface 1406.

The edge 1410 has corners 1414 that correspond to the encapsulant corners 1408. Exposed on the edge sides 1412 are leads 1416. At the corners 1414 of the edge 1410 are corner leads 1418.

The corner leads 1418 may, for example, be internally connected to any of the leads 1416 to create leads, such as, curved side leads 1420. The curved side leads 1420 are shown here, nearest the corner leads 1418 on the edge sides 1412 adjacent to the corners 1414. The curved side leads 1420 are shown bent over the top surface 1404, and form a flat portion 1422 on which a shield may rest.

Figure 15:
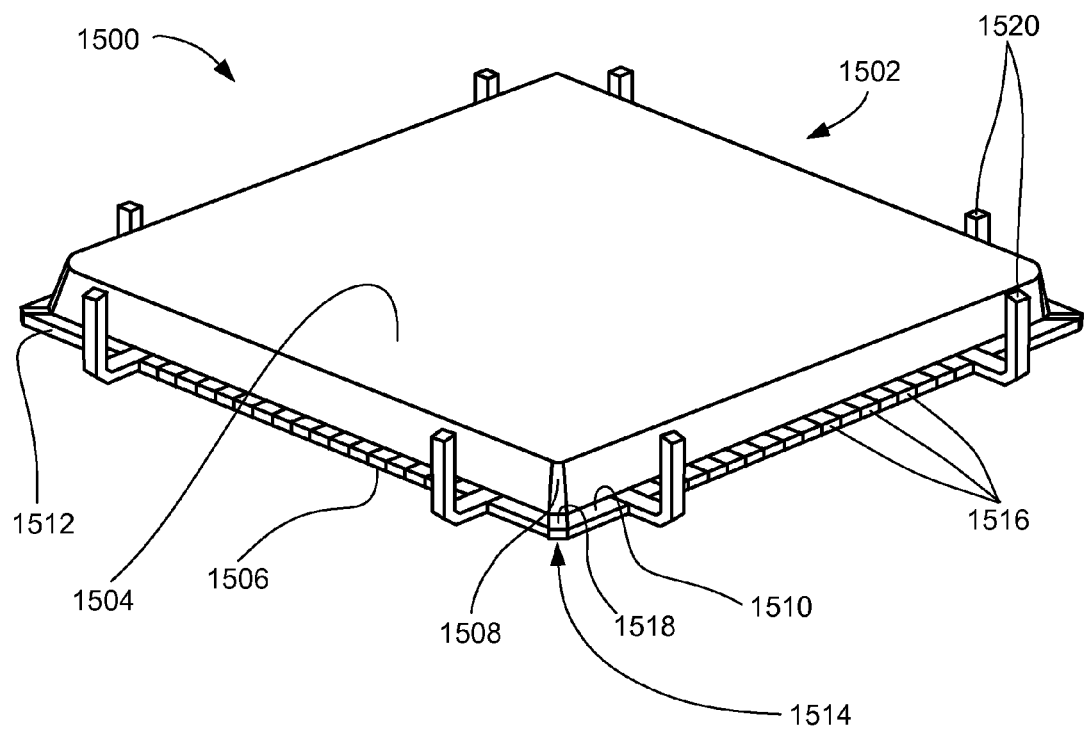
FIG. 15 is an isometric view of an integrated circuit package system in a thirteenth embodiment of the present invention.

Referring now to FIG. 15, therein is shown an isometric view of an integrated circuit package system 1500 in a thirteenth embodiment of the present invention. The integrated circuit package system 1500, such as a QFN, includes an encapsulation 1502.

The encapsulation 1502, such as an EMC, has a top surface 1504 and a bottom surface 1506, which are on opposing sides of the encapsulation 1502. The top surface 1504 and the bottom surface 1506 are shown as rectangular in which the top surface 1504 is smaller in both length and width than the bottom surface 1506. The encapsulation 1502 is also shown having encapsulant corners 1508.

The encapsulation 1502 further includes an edge 1510. The edge 1510 is a portion of the bottom surface 1506 that is exposed by the smaller dimension of the top surface 1504 over the larger dimension of the bottom surface 1506. The edge 1510 has edge sides 1512 corresponding to the rectangular shape of the bottom surface 1506.

The edge 1510 has corners 1514 that correspond to the encapsulant corners 1508. Exposed on the edge sides 1512 are leads 1516. At the corners 1514 of the edge 1510 are corner leads 1518.

The corner leads 1518 may, for example, be internally connected to any of the leads 1516 to create leads, such as, raised side leads 1520. The raised side leads 1520 are shown nearest the corner leads 1518 on the edge sides 1512 adjacent to the corners 1514. The raised side leads 1520 are shown bent upward away from the plane of the bottom surface 1506.

Figure 16:
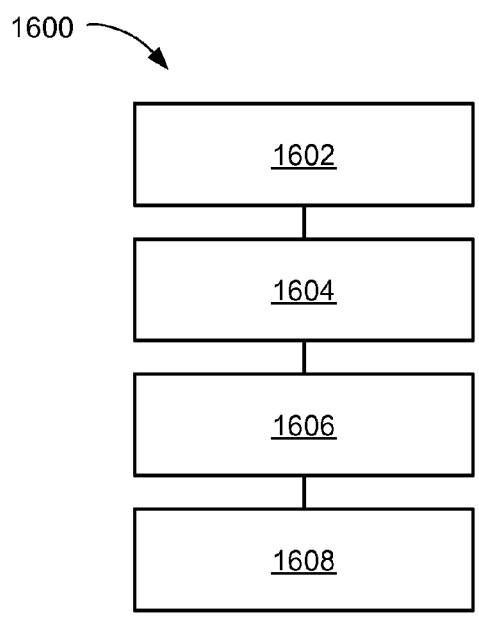
FIG. 16 is a flow chart of a system for manufacture of an integrated circuit package system in various embodiments of the present invention.

Referring now to FIG. 16, therein is shown a flow chart of a package system 1600 for manufacturing an integrated circuit package system 100 in various embodiments of the present invention. The package system 1600 includes providing a die pad, wherein the die pad has a tiebar at a corner in a block 1602; forming a lead, and connecting the lead to the tiebar in a block 1604; connecting an integrated circuit die to the die pad in a block 1606; and forming an encapsulation, having an edge, over the integrated circuit die with the lead extending from and beyond the edge of the encapsulation in a block 1608.

It has been discovered that the present invention thus has numerous aspects. A principle aspect that has been unexpectedly discovered is that the present invention provides added production savings of time, materials, and process steps.

Another aspect is versatility that is added to implement an EMI shield only if the integrated circuit die is sensitive enough to require it. Yet another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   a die pad wherein the die pad has a tiebar at the corner;
   an integrated circuit die mounted to the die pad;
   an encapsulation, having an edge, encapsulating the integrated circuit die;
   a raised lead bent upward, the raised lead extending from the tiebar and above the encapsulation; and
   a conductive shield attached to the raised lead and over the encapsulation, the conductive shield including an exposed surface.

2. The system as claimed in claim 1 wherein the raised lead extends directly from the tiebar and extends horizontally from a corner of the edge.

3. The system as claimed in claim 1 further comprising a lead extending from a side of the edge of the encapsulation.

4. The system as claimed in claim 1 further comprising:
   a lead extending from a side of the edge; and
   wherein:
   the conductive shield is mounted over the encapsulation and attached by fitting, crimping, adhesive, solder, or a combination thereof.

5. The system as claimed in claim 1 further comprising:
   a lead extending from a side of the edge; and
   wherein:
   the conductive shield, having a leg, is mounted over the encapsulation and mounted by the leg to the raised lead by fitting, solder, or a combination thereof.

6. The system as claimed in claim 1 wherein the raised lead is a tiebar lead bent upwards.

7. The system as claimed in claim 6 wherein:
   the raised lead extends directly from the tiebar and from a corner of the edge; and
   wherein:
   the raised lead is bent over the encapsulation to form a curved corner lead or over the encapsulation and then below a top surface of the encapsulation to form a C corner lead.

8. The system as claimed in claim 6 further comprising:
   a lead extending from a side of the edge of the encapsulation; and wherein:
the lead is bent over the encapsulation to form a curved side lead.

9. The system as claimed in claim 6 wherein:
the raised lead is bent upward away from the plane of the die pad; and
wherein:
the conductive shield has a hole aligned to the raised lead and the raised lead in the hole, affixed to the raised lead with solder, fitting, or a combination thereof and mounted over the encapsulation.

10. The system as claimed in claim 6 wherein:
the raised lead is bent over the encapsulation; and
wherein:
the conductive shield is affixed to the raised lead with fitting, crimping, adhesive, solder, or a combination thereof and mounted over the encapsulation.

11. A method for manufacturing an integrated circuit package system comprising:
forming a die pad wherein the die pad has a tiebar at a corner;
connecting an integrated circuit die to the die pad;
forming an encapsulation, having an edge, over the integrated circuit die;
forming a raised lead bent upward, the raised lead above the encapsulation and extending from the tiebar; and
attaching a conductive shield to the raised lead and over the encapsulation, the conductive shield including an exposed surface.

12. The method as claimed in claim 11 wherein forming the raised lead includes extending the tiebar horizontally from a corner of the edge.

13. The method as claimed in claim 11 further comprising forming a lead extending from a side of the edge.

14. The method as claimed in claim 11 further comprising:
forming a lead extending from a side of the edge; and
mounting the conductive shield using fitting, crimping, adhesive, solder, or a combination thereof.

15. The method as claimed in claim 11 further comprising:
forming a lead extending from a side of the edge; and
mounting the conductive shield, having a leg, to the raised lead including:
mounting the conductive shield over the encapsulation; and
mounting the leg to the raised lead using fitting, solder, or a combination thereof.

16. A method for manufacturing an integrated circuit package system comprising:
forming a die pad wherein the die pad has a tiebar at the corner;
forming a lead wherein the lead is connected to the tiebar with a dambar corner or an interconnect;
connecting an integrated circuit die to the die pad;
forming an encapsulation, having an edge, over the integrated circuit die with the lead extending from and beyond the edge;
removing a dambar while retaining the connection between the tiebar and an extended corner lead;
forming a raised lead with the tiebar bent upward having the raised lead above the encapsulation; and
attaching a conductive shield to the raised lead and over the encapsulation, the conductive shield including an exposed surface.

17. The method as claimed in claim 16 wherein:
forming the raised lead includes forming the tiebar extending horizontally from a corner of the edge; and
bending the raised lead over the encapsulation to form a curved corner lead or over the encapsulation and then below a top surface of the encapsulation to form a C corner lead.

18. The method as claimed in claim 16 further comprising:
forming the lead includes forming the lead extending from a side of the edge of the encapsulation; and
bending the lead over the encapsulation to form a curved side lead.

19. The method as claimed in claim 16 further comprising:
mounting the conductive shield having a hole, to the raised lead;
bending the raised lead upward away from the plane of the die pad;
wherein:
mounting the conductive shield includes mounting the conductive shield over the encapsulation;
mounting the conductive shield is performed by aligning the hole with the raised lead and passing the raised lead through the hole; and
mounting the conductive shield includes affixing the conductive shield with solder, fitting, or a combination thereof.

20. The method as claimed in claim 16 further comprising:
bending the raised lead over the encapsulation; and
attaching the conductive shield is performed with fitting, crimping, adhesive, solder, or a combination thereof.

* * * * *